(12) United States Patent
Cusinato

(10) Patent No.: US 6,903,602 B2
(45) Date of Patent: Jun. 7, 2005

(54) CALIBRATED FULLY DIFFERENTIAL RC FILTER

(75) Inventor: Paola Cusinato, Villeneuve Loubet (FR)

(73) Assignee: Texas Instruments Incorporated, Dallas, TX (US)

( * ) Notice: Subject to any disclaimer, the term of this patent is extended or adjusted under 35 U.S.C. 154(b) by 62 days.

(21) Appl. No.: 10/657,618

(22) Filed: Sep. 8, 2003

(65) Prior Publication Data

US 2005/0052225 A1 Mar. 10, 2005

(51) Int. Cl.[7] .................................................. H03K 5/00
(52) U.S. Cl. ........................ 327/552; 327/554; 327/337
(58) Field of Search ................................ 327/337, 344, 327/552–4; 330/9, 107

(56) References Cited

U.S. PATENT DOCUMENTS 6,445,331 B1 * 9/2002 Stegers ........................ 341/172
6,617,908 B1 * 9/2003 Thomsen et al. ............ 327/337
6,670,846 B2 * 12/2003 Yamamoto et al. .......... 327/554

FOREIGN PATENT DOCUMENTS

GB        2170969 A        8/1986

OTHER PUBLICATIONS

"Self–Tuned RC–Active Filters for VLSI", J.B. Hughes, et al., Electronics Letters, vol. 22, No. 19, Sep. 11, 1986, pp. 993–994, XP001149985.

* cited by examiner

Primary Examiner—Timothy P. Callahan
Assistant Examiner—An T. Luu
(74) Attorney, Agent, or Firm—Ronald O. Neerings; Wade James Brady, III; Frederick J. Telecky, Jr.

(57) ABSTRACT

A calibrated RC filter (4) includes a fully differential calibration circuit (10) and finite state machine (8) for determining processing variations in the resistive and capacitive components of a RC filter (6). The finite state machine controls tunable capacitors (7) in the RC filter (6) according to the results of the calibration. In order to provide a symmetrical coverage range, an asymmetrical correction code is used for the nominal case.

9 Claims, 5 Drawing Sheets

$T_C$ = CLOCK PERIOD
$T_{CAL}$ = CALIBRATION TIME

CALIBRATED FULLY DIFFERENTIAL RC FILTER

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to electronic circuits and, more particularly, to RC filters.

2. Description of the Related Art

RC-active filters need calibration because of the poor control on the absolute values of integrated resistors and capacitors. In CMOS technologies, these spreads may produce variations in the RC products as high as ±50%. State-of-the-art processes have high-poly resistance spreads in the range 225–425Ω/☐ (±30%) and the poly1-poly2 capacitance in the range 1.15 –1.65 fF/$\mu$m2 (±17%).

In general, an RC-active filter must have a fairly precise, and predictable, filtering curve. Variations in the RC products due to technology spreads have a strong impact on the shape of the filter. The possible variation in filter shape due to variations in the RC product is usually not acceptable and thus filter calibration is often mandatory.

A technique for automatically tuning integrated circuit RC-active filters is set forth in J. B. Hughes, N. C. Bird, and R. S. Sohn, *Self-Tuned RC-Active Filters for VLSI,* Electronic Letters, 11 Sep. 1986, Vol. 22, No. 19, paper 6—6 (hereinafter "Hughes"). This paper proposes a separate on-chip monitor circuit to evaluate and tune the RC product of an RC-active filter using adjustable capacitor arrays. However, this filter has an asymmetrical coverage range (−33% to +100%) that does not cover all the entire theoretical RC product variation range.

Therefore, a need exist for an RC-active filter with a range that covers all product variations.

BRIEF SUMMARY OF THE INVENTION

In the present invention, a calibrated filter comprises an RC filter having tunable capacitors having a capacitive value responsive to a control code, a fully differential calibration circuit and a logic circuit. The calibration circuit comprises a differential operational amplifier, a differential voltage source, a first resistor selectively coupled between a first terminal of the differential voltage source and a first integrating capacitor coupled across a first input and a first output of the differential operational amplifier, and a second resistor selectively coupled between a second terminal of the differential voltage source and a second integrating capacitor coupled across a second input and a second output of the differential operational amplifier. The logic circuit charges the first and second capacitors through the first and second resistors over a first predetermined number of clock periods and discharging the integrating capacitors by a predetermined voltage over a second predetermined number of clock periods. A control code for tuning the tunable capacitors by counting the number of clock periods to needed to discharge the integrating capacitors to a predetermined voltage level.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 6 illustrates the timing signals for the finite state machine of FIG. 1a; and FIG. 7 illustrates a Butterworth RC filter that could be used as the RC filter in FIG. 1a.

DETAILED DESCRIPTION OF THE INVENTION

The present invention is best understood in relation to FIGS. 1–7 of the drawings, like numerals being used for like elements of the various drawings.

Figure 1A:
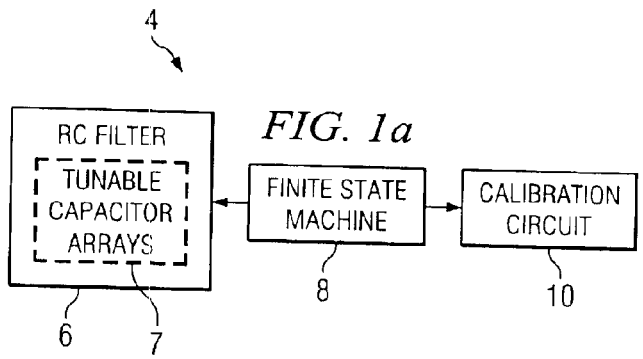
FIG. 1a illustrates a block diagram of a calibrated fully differential RC filter.

FIG. 1a illustrates a block diagram of a calibrated RC filter 4. An RC filter 6 uses tunable capacitor arrays 7 (see FIG. 1b) in its design to compensate for processing variations. The tunable capacitor arrays 7 are set by a finite state machine (FSM) 8 according to values determined through use of a calibration circuit 10.

Figure 1B:
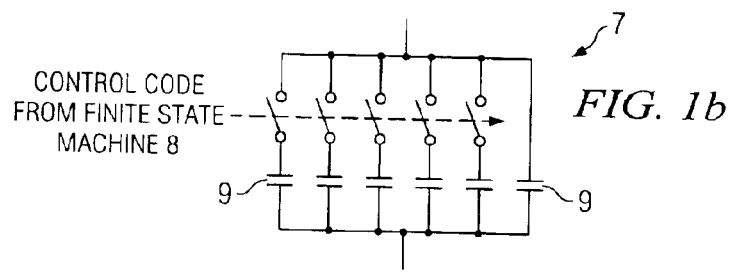
FIG. 1b illustrates a schematic representation of a tunable capacitor array.

FIG. 1b illustrates a schematic of a tunable capacitor array 7. Each tunable capacitor array 7 uses a plurality of binary-weighted capacitors 9 that can be selectively enabled or disabled responsive to a control word from the finite state machine 8. Accordingly, the capacitance can be varied from a minimal capacitance (one capacitor 9 enabled) to a maximum capacitance (all capacitors 9 enabled) with a nominal center value equal to the design value of the capacitor. The range of the capacitor array 7 is as great as the combined spread of the resistors and capacitors (i.e., ±47% for the previously specified processing technology).

Figure 2:
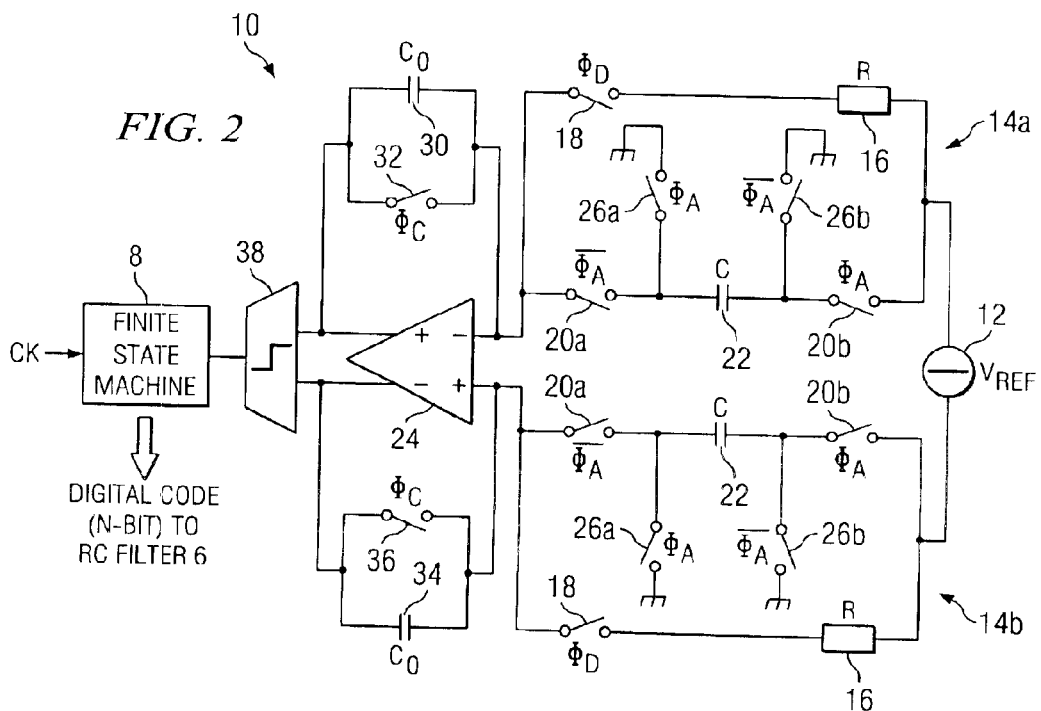
FIG. 2 illustrates a schematic representation of a calibration circuit.

FIG. 2 illustrates a schematic representation of a calibration circuit 10. A voltage source 12 is coupled between two switched RC stages 14a–b. Each switched RC stage 14a–b comprises a resistive path with a resistor 16 of value R. Which coupled to switch 18. Switch 18 is switched by control signal $\Phi_D$. A switched capacitive path is parallel to the resistive path. Switches 20a and 20b are coupled to either side of capacitor 22, having value C, and are switched by $\overline{\Phi_A}$ and $\Phi_A$, respectively. Switch 20a is coupled between one terminal of capacitor 22 and an input to operational amplifier 24 (for RC stage 14a, the switch 20a is coupled to the inverting input of operational amplifier 24 and for RC stage 14b, the switch 20a is coupled to the non-inverting input of operational amplifier 24). Switch 20b is coupled between the other terminal of capacitor 22 and the voltage supply 12. A second pair of switches 26a and 26b are coupled between the respective terminals of capacitor 22 and ground. Switch 26a is controlled by control signal $\Phi_A$ and switch 26b is controlled by control signal $\overline{\Phi_A}$.

Accordingly, for each RC stage 14a–b, capacitor 22 will either be coupled between an input to operation amplifier 24 and ground or between the voltage supply 12 and ground, responsive to control signal $\Phi_A$.

A capacitor 30 (having value $C_0$, which is equal to C for the embodiment described herein) in parallel with switch 32 (controlled by control signal $\Phi_C$) is coupled between inverting input of operational amplifier 24 and the non-inverting differential output of operational amplifier 24. A capacitor 34 in parallel with switch 36 (also controlled by control signal $\Phi_C$) is coupled between non-inverting input of operational amplifier 24 and the inverting differential output of operational amplifier 24. The inverting and non-inverting differential outputs of operational amplifier 24 are coupled to latch comparator 38. The output of latch comparator 38 is coupled to finite state machine 8.

The operational amplifier 24 can be, for example, a Miller-compensated structure with NMOS input stage and NMOS output stage.

The latch comparator 38 used in the calibration circuit is a fully differential implementation which doubles the input dynamic of the latch comparator (compared to a single ended solution) and thus reduces the problem of input offset. The fully differential solution acts like an amplification stage, thus reducing the complexity of the comparison stage.

Figure 3:
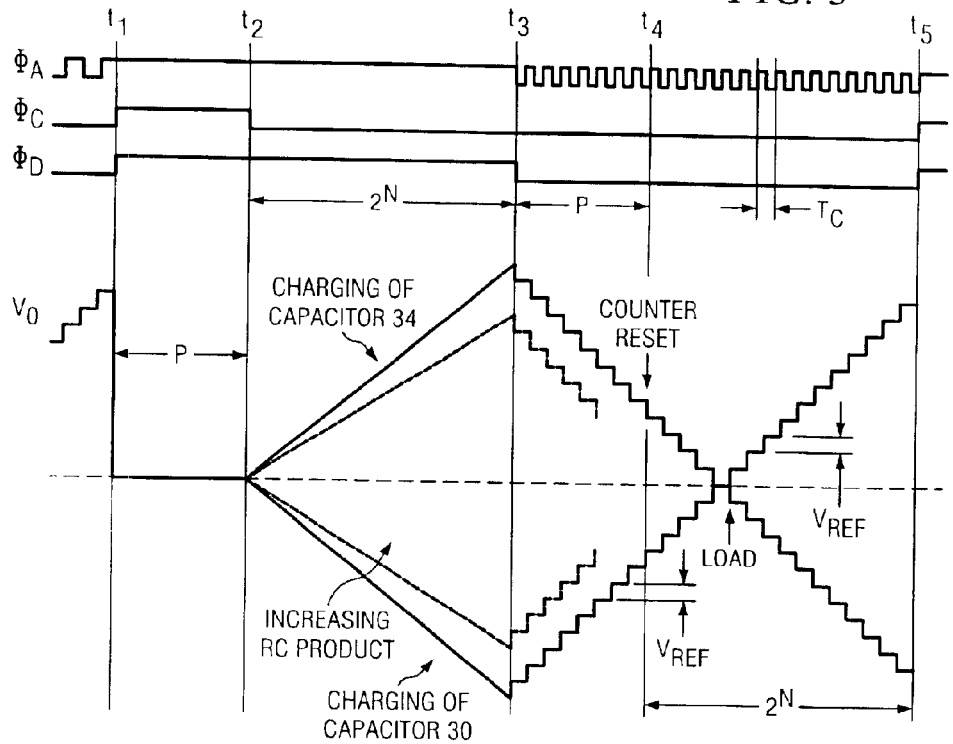
FIG. 3 illustrates a timing diagram of the calibration circuit of FIG. 2.
Figure 4A:
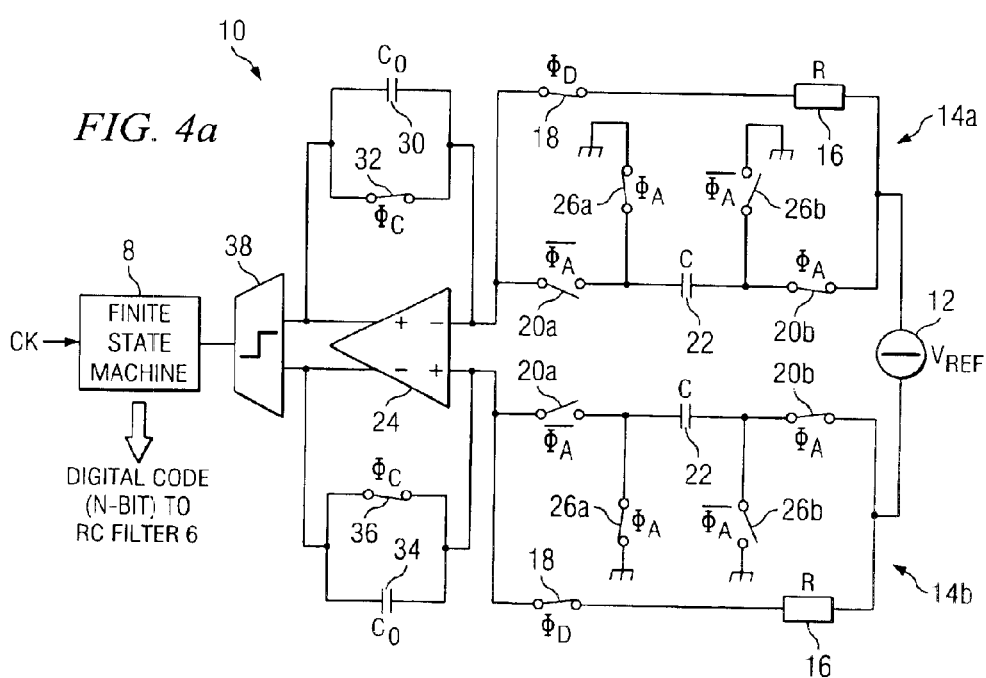
FIGS. 4a through 4c illustrate the calibration circuit of FIG. 2 at different modes of the timing diagram of FIG. 3.
Figure 4B:
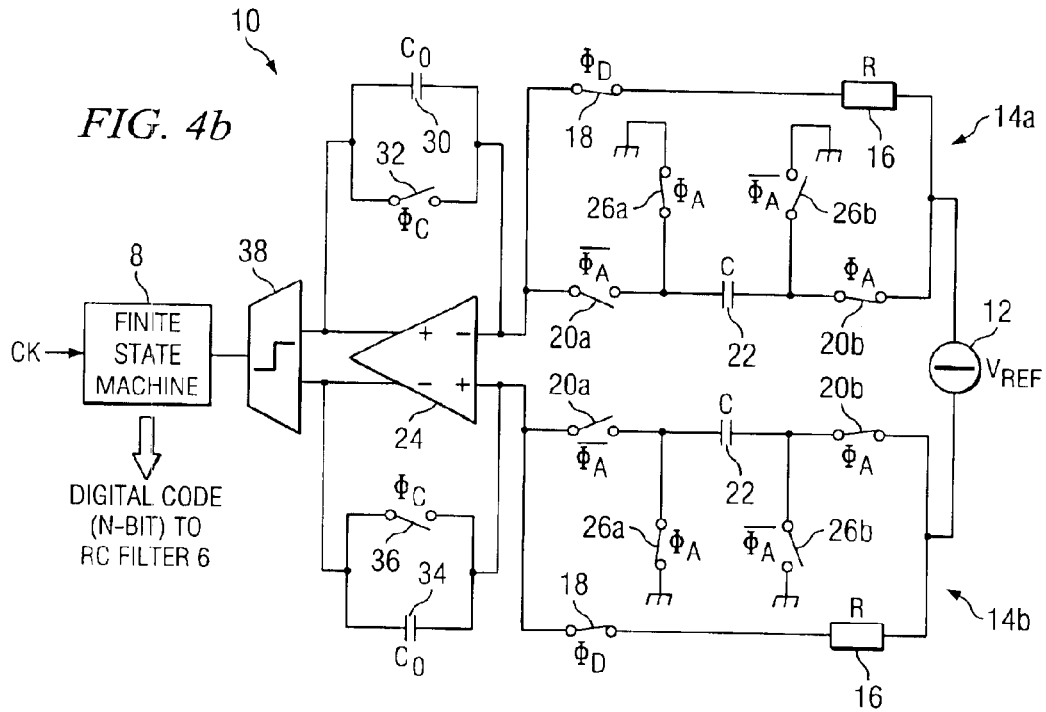
Figure 4C:
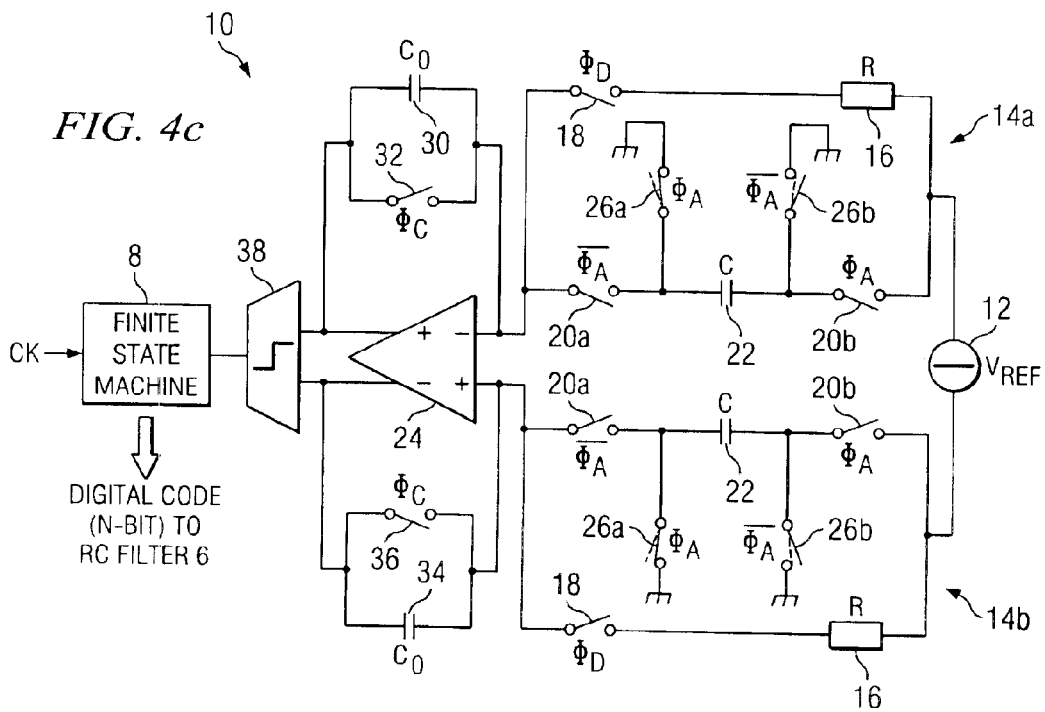

The operation of the calibration circuit 10 is best described in connection with the timing diagram of FIG. 3 and the schematic diagrams of FIGS. 4a–c, showing the calibration circuit in different stages of a calibration cycle.

Between times $t_1$ and $t_2$ in FIG. 3, the calibration circuit is in reset mode, shown in FIG. 4a. In this mode, $\Phi_A$, $\Phi_C$ and $\Phi_D$ are all high. Thus, switches 18, 20b, 26a 32 and 36 are closed and switches 20a and 26b are open. Switch 32 shorts the terminals of capacitor 30 and switch 36 shorts the terminals of capacitor 34, hence, both capacitors 32 and 34 are discharged. Capacitors 22 are charged to $\pm V_{REF}$. $V_0$, the differential output of the operational amplifier 24 is taken to its common mode output ($V_{dd}/2$, where $V_{dd}$ is the power supply voltage to the operational amplifier). The time between $t_1$ and $t_2$ is P clocks.

Between times $t_2$ and $t_3$ in FIG. 3, the calibration circuit is in integration mode, shown in FIG. 4b. In this mode, $\Phi_C$ transitions low while $\Phi_A$ and $\Phi_D$ remain high. With $\Phi_C$ low, switches 32 and 34 are open, allowing $V_{REF}$ to charge the integrating capacitors 30 and 34 through resistors 16 (the charging of capacitor 30 is shown as a negatively sloping line and the charging of capacitor 34 is shown as a positively charging line). As can be seen in FIG. 3, the rate of charging the capacitors 30 and 34 depends upon the RC product; a larger RC product results in a smaller slope. The integration mode lasts for $2^N$ clocks.

During times $t_3$ and $t_5$ in FIG. 3, $\Phi_A$ is clocked and $\Phi_D$ transitions low ($\Phi_C$ remains low), as shown in FIG. 4c. With $\Phi_D$ low, the current path between the resistors 16 and capacitors 30 and 34 is removed. On each clock, when $\Phi_A$ transitions low, the integrating capacitors 30 and 34 are charged by an amount equal to $V_{REF}$ (or $-V_{REF}$). After P clocks ($t_4$), a counter is reset in the FSM 8. From $t_4$, $2^N$ clocks are counted to $t_5$.

It is worth noting that, since the analog section of the filter calibration system is fully differential, the reference voltage is also a differential voltage, generated by means of a dedicated operational amplifier. In any case, for simplicity, all the following calculations are made in Single-Ended (SE). The dynamic required by the calibration system is $[-2^N V_{REF}; (2^N+P)V_{REF}]$. In an actual design N=5, P=16 and $V_{REF}$=20 mV; thus the required dynamic results [−640 mV; 960 mV] (SE) is thus well below the maximum dynamic of the operational amplifier.

In addition, the step of the positive-going staircase can be increased (up to 30 mV), thus reducing the influence of the input-offset of the latch comparator. Of course, in this case the constant current producing the negative- going ramp is increased proportionally. Practically, this means increasing the gain of the preamplification stage in front of the latch comparator.

The state of the FSM's counter at the zero-crossing gives the measure of the RC product, which is designed with a nominal value that is 4/3 times the clock period $T_C$ (the reason of this choice will be detailed later). The counter is reset at $t_4$ (P clock periods after $t_3$) and, with the binary weighted capacitor array designed according to FIG. 1b, the code in the $(2^N+P)$ state counter at the zero-crossing is just the one required to tune the filter to its nominal frequency response.

The control circuit parameters P and N are chosen according to (a) the expected processing spreads, (b) the required filter accuracy and (c) the maximum allowed calibration time. It can be demonstrated that this technique compensates processing spreads in the range $\pm 100/(1+P/2^{N-1})\%$ and produces a filter with an accuracy of $\pm 50/(P+1)\%$.

The calibration time ($T_{CAL}$) is equal to $T_{SU}+2(P+2^{N-1})T_C$, where $T_{SU}$ is a start-up time necessary to properly initialize the FSM. Assuming $T_{SU}$ negligible, this means that doubling the accuracy of the algorithm means roughly doubling $T_{CAL}$.

For P=16 and $2^N$=32 (i.e. N=5), the filter accuracy is set to less than 3% and allows a maximum RC product spread of ±50% (sufficient for current day technologies with spreads of ±47%).

As previously stated, the default setting for the RC product is fixed to $4/3T_C$. This solution has been adopted to cover the full range of the RC product spreading. In fact, the voltage value at the output of the integrator at the end of the integration phase ($t_2-t_3$) results $$V_0 = V_{REF} 2^N \frac{1}{R*C*f_C},$$

, where R* and C* are the resistor and the capacitor implemented in the design. If the maximum spread is ±50% (as supposed), the value of $V_0$ may vary from $2/3V_0^*$ (i.e., $V_0^*/(1+0.5)$) up to $2V_0^*$ (i.e., $V_0^*/(1-0.5)$), where $V_0^*$ is the value of the integrated voltage with ideal conditions. This means that there is an asymmetry in the integrated voltage between the positive and the negative spread. Thus, if the RC product is equal to $T_C$, there is no chance to correct the case when the integration voltage results $2V_0^*$.

The calibration range results in this case [−33% ; +100%]. In fact, for RC changes in the range ±50%, C array will cover ±(1/50%), which is [−33% ; +100%]. If the RC product is set to $4/3T_C$, the voltage range at the output of the integrator results $$[1/2V_0^*; -3/2V_0^*] \left( \text{i.e.} \left[ \frac{V_0^*}{\frac{4}{3}(1+0.5)} ; \frac{-V_0^*}{\frac{4}{3}(1-0.5)} \right] \right)$$

and this allows to perform the calibration covering the full range. Of course, in this case, there is an asymmetry in the nominal case digital code, which controls the capacitor array.

The code can be calculated as follows. Using $$\frac{1}{\left(1 \pm \frac{x_{1,2}}{100}\right)}$$

as the coverage of the calibration algorithm, where $x_{1,2}$ are the minimum and maximum spread of the RC product, and this range has to be ±50%, the corresponding range of variation of the RC product can be calculated as:

$$\frac{1}{\left(1 - \frac{x_1}{100}\right)} = \frac{100}{100 - x_1} = \frac{100}{66}(+50\%) \Rightarrow x_1 = 33(-33\%)$$

$$\frac{1}{\left(1 + \frac{x_2}{100}\right)} = \frac{100}{100 + x_2} = \frac{100}{200}(-50\%) \Rightarrow x_2 = 100(+100\%)$$

Accordingly, a symmetrical correction range needs an asymmetrical correction code for the nominal case.

Thus, in the first case, no spread gives the code 10000 (assuming N=5), while in the second case, in the same condition, the driving code will be 01000 (since the RC product is greater than $T_C$). With this configuration, the maximum RC product (which corresponds to 1/2 $V_o^*$) will give the minimum digital code (00000), while the minimum RC product (3/2 $V_o^*$) will give the maximum digital code (11111).

Figure 5:
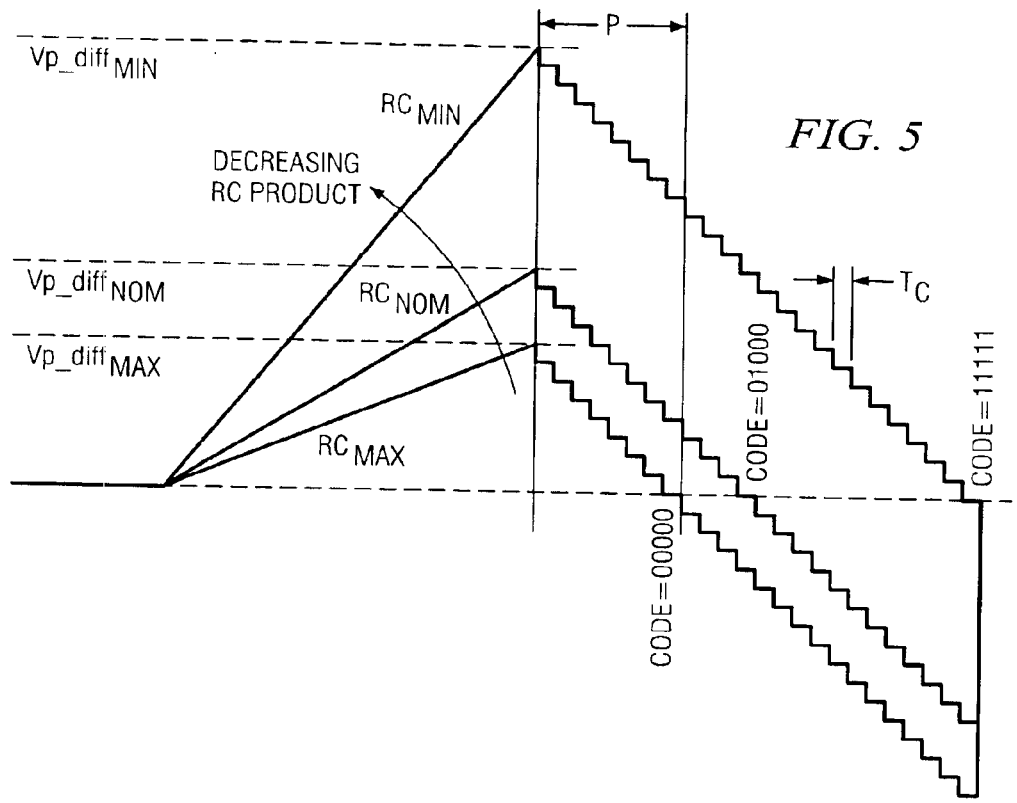
FIG. 5 shows the behavior of the calibration system in all tuning conditions ($RC_{MIN}$, $RC_{NOM}$, $RC_{MAX}$)

FIG. 5 shows the behavior of the calibration system in all the tuning conditions ($RC_{MIN}$, $RC_{NOM}$, $RC_{MAX}$). In analyzing the nominal case and the limits of the calibration range, $Vp\_diff_{NOM}$ (the differential output voltage of the integrator at the end of the integration phase in the nominal case) is defined as $$\frac{V_{REF} 2^N T_{CK}}{\frac{4}{3} RC}.$$

The following relationship gives the value of the output code since it calculates the number of discharging steps by equating the integrated voltage on the integrator capacitor with the product of the single discharging step by the number of steps required to completely discharge the capacitor.

$$\frac{V_{REF} 2^N T_{CK}}{\frac{4}{3} RC} = \frac{V_{REF} C_1 (n_{NOM} + P)}{C_0}, \text{ where } T_{CK} = RC \text{ and } C_1 = C_0;$$

$$\frac{2^N}{\frac{4}{3}} = n_{NOM} + P; \text{ and}$$

$$n_{NOM} = 3 \times 2^{N-2} - P.$$

With N=5 and P=16 (as in the illustrated case), $n_{NOM}$=8 and thus the corresponding digital code for the switches is 01000.

The same operation can be performed both for the maximum and minimum RC product. For the maximum RC product:

$$Vp\_diff_{MAX} = \frac{V_{REF} 2^N T_{CK}}{2RC};$$

$$\frac{V_{REF} 2^N T_{CK}}{2RC} = \frac{V_{REF} C_1 (n_{MAX} + P)}{C_0}, \text{ where } T_{CK} = RC \text{ and } C_1 = C_0; \text{ and}$$

$$n_{MAX} = 2^{N-1} - P.$$

Thus, $n_{MAX}$=0 and then the corresponding digital code for the switches is 00000.

For the minimum RC product:

$$Vp\_diff_{MIN} = \frac{V_{REF} 2^N T_{CK}}{\frac{2}{3} RC};$$

$$\frac{V_{REF} 2^N T_{CK}}{\frac{2}{3} RC} = \frac{V_{REF} C_1 (n_{MIN} + P)}{C_0}, \text{ where } T_{CK} = RC \text{ and } C_1 = C_0; \text{ and}$$

$$\frac{2^N}{\frac{2}{3}} = n_{MIN} + P.$$

Thus, $n_{MIN}$=32 and then the corresponding digital code for the switches is 11111.

In summary, by setting RC=4/3$T_C$, it is possible to cover the whole spreading range of ±47% for a current processing technology.

Figure 6:
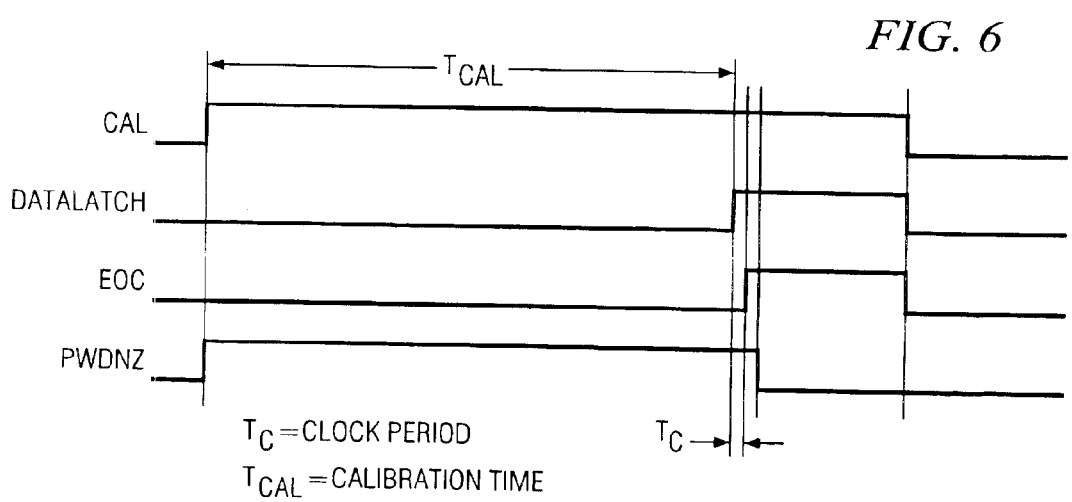

FIG. 6 shows the timing for the FSM 8. The FSM 8 is activated by an external signal (CAL); after $T_{CAL}$, the filter calibration is performed, the digital code is stored in a register and then, a signal (EOC, End Of Calibration, active high) is delivered to the control block. Thus, the calibration system goes automatically in power-off mode, ready for another calibration operation. When CAL goes down also EOC is set to '0'.

The calibration system 10 presents a fully differential architecture instead of a single ended solution as proposed in Hughes. This choice has been made, even if the architecture of the integrator is more complicated, since it doubles the number of passive elements (R, C) and requires a fully differential operational amplifier, because it allows simplification of the architecture of the latch comparator, since the fully differential solution acts like a pre-amplification stage for the comparison stage. Thus a simple latch comparator, without any pre-amplification stage, can be used.

From an area point of view, the two solutions are comparable, but the fully differential solution proposed herein presents some key advantages: (1) the result of the calibration process is independent from any error in the reference signals (both for the integrator and for the latch comparator), and (2) the clock-feedthrough and the charge injection caused by the switches in the switched capacitor integrator does not influence the result. It is worth noting that in this case no delayed phases have to be used since the input signal (reference voltage) is constant.

Figure 7:
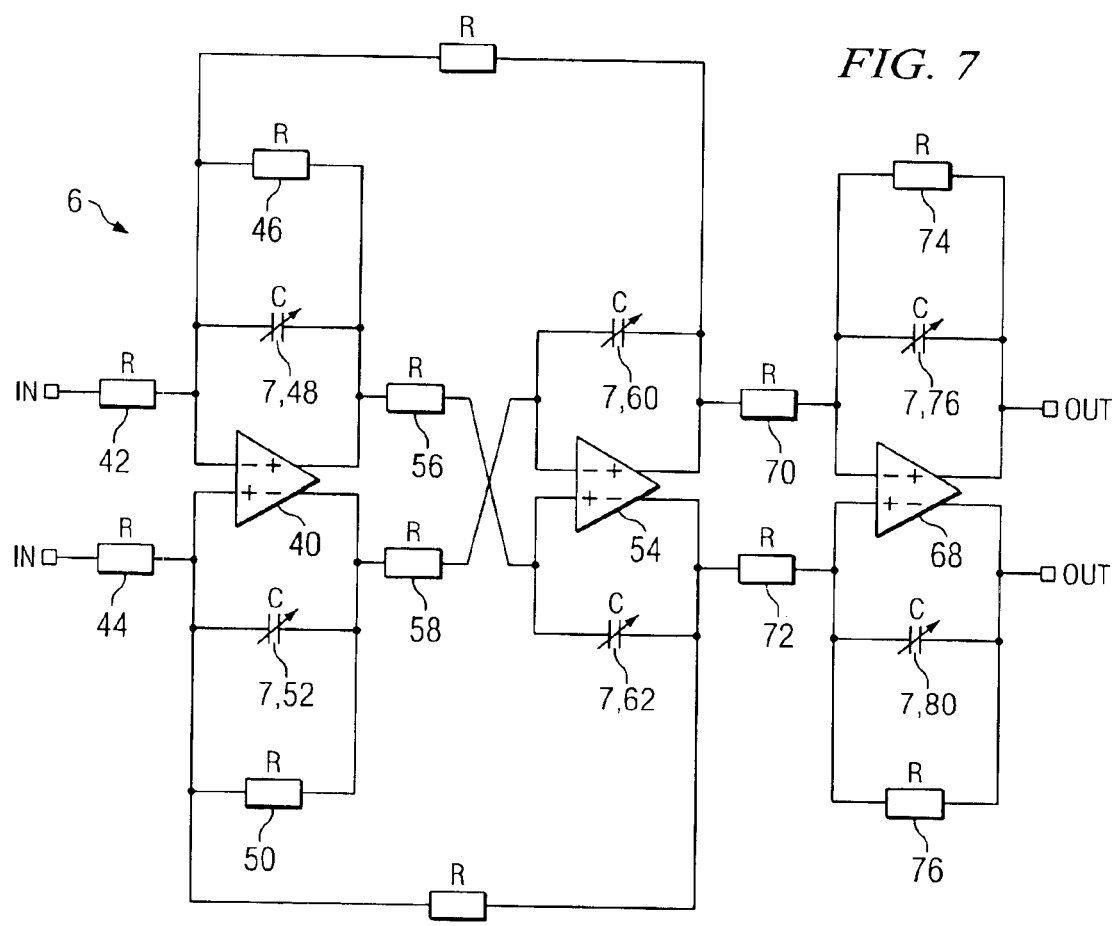

FIG. 7 illustrates a Butterworth RC filter that could be used as the RC filter 6 in FIG. 1a. In FIG. 7, a differential input (IN) is coupled to the inverting and non-inverting inputs of a differential operational amplifier 40 through resistors 42 and 44, respectively. Resistor 46 and tunable capacitor 48 are coupled between the inverting input and non-inverting output of the operational amplifier 40. Resistor 50 and tunable capacitor 52 are coupled between the non-inverting input and inverting output of the operational amplifier 40. The non-inverting output of operational amplifier 40 is coupled to the non-inverting output of operational amplifier 54 through resistor 56. The inverting output of operational amplifier 40 is coupled to the inverting input output of operational amplifier 54 through resistor 58. Tunable capacitor 60 is coupled between the inverting input and non-inverting output of operational amplifier 54. Tunable capacitor 62 is coupled between the non-inverting input and inverting output of operational amplifier 54. Resistor 64 is coupled between the inverting input of operational amplifier 40 and the non-inverting output of operational amplifier 54. Resistor 66 is coupled between the non-inverting input of operational amplifier 40 and the inverting output of operational amplifier 54. The non-inverting output of operational amplifier 54 is coupled to the inverting input of operational amplifier 68 through resistor 70. The inverting output of operational amplifier 54 is coupled to the non-inverting input of operational amplifier 68 through resistor 72. Resistor 74 and tunable capacitor 76 are coupled between the inverting input and non-inverting output of operational amplifier 68. Resistor 78 and tunable capacitor 80 are coupled between the non- inverting input and inverting output of operational amplifier 68. Operational amplifier 68 provides the filter differential output (OUT).

The tunable capacitors of the filter are made adjustable by using programmable binary-weighted capacitor arrays, as shown in FIG. 1b, which are designed to have nominal center values equal to the design values (C). The range of these capacitors should be at least as great as the combined spreads of resistors and capacitors (approximately ±50%). Tuning is achieved by supplying the appropriate digital code to the arrays as calculated by the finite state machine 8.

The number of bits composing the code driving each capacitor array 7 (and hence the resolution of the capacitor array 7) determines the accuracy of the calibration; it is worth noting that this number influences also the calibration time. In other words, this means that increasing the filter accuracy means increasing the calibration time: in particular, one more bit means doubling the time required for the calibration. The choice of the code length is then a trade-off between these two issues.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A calibrated filter comprising:
    an RC filter having tunable capacitors having a capacitive value responsive to a control code;
    a fully differential calibration circuit comprising:
        a differential operational amplifier;
        a differential voltage source;
        a first resistor selectively coupled between a first terminal of the differential voltage source and a first integrating capacitor coupled across a first input and a first output of the differential operational amplifier;
        a second resistor selectively coupled between a second terminal of the differential voltage source and a second integrating capacitor coupled across a second input and a second output of the differential operational amplifier;
    a logic circuit for:
        charging the first and second capacitors through the first and second resistors over a first predetermined number of clock periods;
        discharging the integrating capacitors by a predetermined voltage over a second predetermined number of clock periods; and
        counting the number of clock periods to needed to discharge the integrating capacitors to a predetermined voltage level to generate the control code for tuning the tunable capacitors.

2. The calibrated filter of claim 1 wherein the fully differential calibration circuit includes a differential operational amplifier coupled to a differential comparator circuit.

3. The calibrated filter of claim 1 wherein the calibration circuit has a symmetrical correction range.

4. The calibrated filter of claim 3 wherein the correction code is asymmetrical for the nominal capacitive value.

5. The calibrated filter of claim 4 wherein the first and second resistors have a nominal value R and the first and second capacitors have a nominal value C, and where $RC=4/3T_C$, where $T_C$ equals a clock period.

6. A method of calibrating a filter, comprising the steps of:
    providing an RC filter having tunable capacitors having a capacitive value responsive to a control code;
    providing a fully differential calibration circuit comprising a differential operational amplifier, a differential voltage source, a first resistor selectively coupled between a first terminal of the differential voltage source and a first integrating capacitor coupled across a first input and a first output of the differential operational amplifier, and a second resistor selectively coupled between a second terminal of the differential voltage source and a second integrating capacitor coupled across a second input and a second output of the differential operational amplifier;
    charging the first and second capacitors through the first and second resistors over a first predetermined number of clock periods;
    discharging the integrating capacitors by a predetermined voltage over a second predetermined number of clock periods; and
    counting the number of clock periods to needed to discharge the integrating capacitors to a predetermined voltage level to generate the control code for tuning the tunable capacitors.

7. The method of claim 6 and further comprising the step of driving a comparator circuit with the differential operational amplifier.

8. The method of claim 6 and further comprising the step of biasing the correction code to provide a symmetrical correction range.

9. The method of claim 6 wherein the first and second resistors have a nominal value R first and second capacitors have a nominal value C, and further comprising the step of setting $RC=4/3T_C$, where $T_C$ equals a clock period.

* * * * *